(12) United States Patent
Fukuda

(10) Patent No.: US 8,110,978 B2
(45) Date of Patent: Feb. 7, 2012

(54) DISPLAY DEVICE

(75) Inventor: Toshihiro Fukuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 281 days.

(21) Appl. No.: 12/616,611

(22) Filed: Nov. 11, 2009

(65) Prior Publication Data

US 2010/0117528 A1    May 13, 2010

(30) Foreign Application Priority Data

Nov. 13, 2008    (JP) .................................. 2008-291352

(51) Int. Cl.
*H01L 51/52*    (2006.01)

(52) U.S. Cl. ........................................ 313/500; 313/504

(58) Field of Classification Search .................... 257/40, 257/72, 98–100, 642–643, 759; 313/498–512, 313/110–127; 427/58, 64, 66, 532–535, 427/539; 428/690–691, 917; 438/26–29, 438/34, 82, 455; 445/24–25; 315/169.1, 315/169.3

See application file for complete search history.

(56) References Cited

FOREIGN PATENT DOCUMENTS

| JP | 2006-073219 | 3/2006 |
|----|-------------|--------|
| JP | 2009-59809  | 3/2009 |
| JP | 2009-104969 | 5/2009 |

*Primary Examiner* — Peter Macchiarolo
*Assistant Examiner* — Donald Raleigh
(74) *Attorney, Agent, or Firm* — SNR Denton US LLP

(57) ABSTRACT

The present invention provides a display device including: a pair of substrates in which a plurality of pixels are disposed in a matrix form as a whole, the pixels being configured with pixels corresponding to R (red), G (green), or B (blue), and the pixels corresponding to the R, G, or B having size different from each other; a self-luminous photo-emission element formed in a region corresponding to each of the pixels, on one of the pair of substrates; and a black matrix layer formed in a region corresponding to among the pixels, on the other of the pair of substrates. Formula (1) and formula (2) are satisfied, or formula (1) and formula (3) are satisfied.

12 Claims, 7 Drawing Sheets

$L_{RH}=L_{GH}=L_{BH}$ $0.95 L_{GH} \leq L_{RH} < L_{GH} < L_{BH} \leq 1.05 L_{GH}$

R∽G∽B
SIMILAR OPENING SHAPE

DISPLAY DEVICE

BACKGROUND OF THE INVENTION

1. Field of the Invention

The present invention relates to a display device including a self-luminous photo-emission element such as an organic EL (electroluminescence) element.

2. Description of the Related Art

In a display device, a viewing angle characteristic of luminance is a factor causing a remarkable reduction in a display quality. Typically, in a self-luminous photo-emission element (self-luminous element) such as an organic EL element, an element is configured so as to improve extraction efficiency from the front direction, by utilizing perfect diffusion, the microcavity efficiency of a resonator structure, or the like. That is, since a photo-emission section is designed to be disposed close to a perfect-diffusion light source, it is said that the photo-emission itself is advantageous in terms of the viewing angle characteristic of the luminance However, in the case where the display device is configured by using such a self-luminous element, to realize a high contrast, there is a case where a black matrix layer is provided for the purpose of suppressing reflection of natural light from a backplane (in a pair of substrates, the substrate on a side opposite from a display plane). Moreover, to improve color purity in addition to the high contrast, there is a case where the black matrix layer which is integrated with a color filter is provided.

Here, in a self-luminous display device of the related art in which such a black matrix layer is provided, the black matrix layer is disposed on the substrate facing the backplane, in the pair of substrates. This is because, although heat-resistance and reliability in the photo-emission element are demanded when forming the black matrix layer on the backplane, it is difficult to find such a material at the present moment. Thus, it is substantially necessary to form the black matrix layer on the facing substrate side.

Therefore, when the backplane, and the facing substrate in which the black matrix layer is formed are aligned and bonded to each other, there is a gap formed by the thickness of an adhesion layer (sealing layer) for bonding, and a protective layer, between the photo-emission section and the black matrix layer. Typically, the distance between the photo-emission section and the black matrix layer, including the adhesion layer and the protective layer, is approximately 30 μm.

As an example of the self-luminous display device including such a self-luminous photo-emission layer, there is an organic EL display device (for example, Japanese Unexamined Patent Publication No. 2006-73219).

SUMMARY OF THE INVENTION

In the case of the self-luminous element such as the organic EL element, although the photo-emission itself is perfectly diffused, the size of the photo-emission section is limited to be equal to or smaller than that of a pixel pitch. Thus, in the case where there is a light-shielding black matrix layer or the like, when viewing a pixel from the oblique direction, a shadowed portion is generated due to the black matrix layer. Since the shadowed portion overshadows the photo-emission section, a light-shielding region is generated. Accordingly, there is an issue that the luminance is reduced in accordance with the size of this light-shielding region (the viewing angle characteristic of the luminance is deteriorated). Moreover, in the case of the photo-emission element utilizing the microcavity effect, the deterioration in the viewing angle characteristic of the luminance is more remarkable, since influence of a light distribution characteristic of the photo-emission section is added.

The light-shielding phenomenon as described above specially occurs in the display device including a self-luminous element with a finite size. In a liquid crystal display device in which a perfect-diffusion light source (backlight light source) is disposed separately from a liquid crystal panel, such a light-shielding phenomenon does not occur. This is because, in a liquid crystal panel in which a cell gap is thin, the perfect-diffusion backlight light source with the dimension larger than that of an opening region may be regarded as an imaginary diffusion light source formed immediately below the black matrix layer. As a result, in the liquid crystal panel, the viewing angle characteristic of the luminance approximately accords with that of the light source, and it hardly becomes an issue. In the viewing angle characteristic in the liquid crystal display device, an actual issue is contrast reduction and a color shift generated with the wavelength dependency, caused by a spectral characteristic of refractive index anisotropy in a liquid crystal molecule.

To improve the luminance reduction caused by the light-shielding as such a viewing angle characteristic, there has been no proposal so far. For example, in Japanese Unexamined Patent Publication No. 2006-73219, proposed is only the organic EL display device in which light leaked from a certain pixel to an immediately adjacent pixel enters to an interface of air and glass at an angle equal to or larger than a critical angle, thereby color mixture is prevented.

Moreover, in the case of the self-luminous element such as the organic EL element, the degree of deterioration of the element due to aging is varied depending on a photo-emission color of the element. Thus, in the case where an aperture ratio is identical among the pixels corresponding to R (red), G (green), and B (blue), with the elapse of time, the luminance in each of the colors differs from each other, and the color shift phenomenon occurs. Thus, a method of the related art has been used in which the aperture ratio differs from each other among the pixels corresponding to R, G, and B, and the current density is adjusted for each color at the time of the display drive, thereby a deterioration curve (degree of deterioration) due to aging is approximately at the same level among R, G, and B.

However, in the case where the aperture ratio differs from each other among the pixels corresponding to R, G, and B, since the opening dimension differs from each other corresponding to each of the colors, the state of vignetting also differs from each other among the pixels corresponding to R, G, and B. Accordingly, the luminance (light intensity balance) of each color differs from each other in accordance with the viewing angle characteristic, and thereby the so-called color shift phenomenon is brought. When such a color shift phenomenon occurs, the display quality is deteriorated.

In view of the foregoing, in a display device including a self-luminous photo-emission element, it is desirable to provide a display device capable of realizing long service life of a whole panel, while improving display quality.

According to an embodiment of the present invention, there is provided a first display device including: a pair of substrates in which a plurality of pixels are disposed in a matrix form as a whole, the pixels being configured with pixels corresponding to R (red), G (green), or B (blue), and the pixels corresponding to the R, G, or B having size different from each other; a self-luminous photo-emission element formed in a region corresponding to each of the pixels, on one of the pair of substrates; and a black matrix layer formed in a region corresponding to between the pixels, on the other of the pair of substrates. Formula (1) and formula (2) below are satisfied, or formula (1) and formula (3) below are satisfied, where $W_{BM}$ is an opening dimension in the black matrix layer, $W_{LD}$ is a photo-emission region dimension in the photo-emission element, and D is an air length between the photo-emission element and the black matrix layer.

$$2\sqrt{3} \leq (|W_{BM} - W_{LD}|/D) \tag{1}$$

$$0.95 \leq \text{(relative difference of values } (W_{EL}/D) \text{ among the pixels corresponding to the } R, G, \text{ and } B) \leq 1.05 \text{ (when } W_{LD} < W_{BM}) \tag{2}$$

$$0.95 \leq \text{(relative difference of values } (W_{BM}/D) \text{ among the pixels corresponding to the } R, G, \text{ and } B) \leq 1.05 \text{ (when } W_{LD} \geq W_{BM}) \tag{3}$$

In the first display device according to an embodiment of the present invention, by satisfying the formula (1) above, within the range where the viewing angle is from 0° to 60° both inclusive, vignetting of the display light from the photo-emission element, due to the light-shielding with the black matrix layer, does not occur at all. Moreover, since the pixel size is different from each other among the pixels corresponding to R, G, and B, by adjusting the current density among the pixels corresponding to R, G, and B at the time of the display drive, the degree of deterioration due to aging may be approximately at the same level as each other. Moreover, by satisfying the formula (2) or the formula (3) above, the color shift in accordance with the viewing angle, due to the difference of the vignetting state among the pixels corresponding to R, G, and B, is suppressed.

According to an embodiment of the present invention, there is provided a second display device including: a pair of substrates in which a plurality of pixels are disposed in a matrix form as a whole, the pixels being configured with pixels corresponding to R (red), G (green), or B (blue), and the pixels corresponding to the R, G, or B having size different from each other; a self-luminous photo-emission element formed in a region corresponding to each of the pixels, on one of the pair of substrates; and a black matrix layer formed in a region corresponding to between the pixels, on the other of the pair of substrates. Formula (4) to formula (7) below are satisfied, where $W_{BM}$ is an opening dimension in the black matrix layer, $W_{LD}$ is a photo-emission region dimension in the photo-emission element, and D is an air length between the photo-emission element and the black matrix layer.

$$2\sqrt{3} > (|W_{BM} - W_{LD}|/D) \tag{4}$$

$$W_{LD} < W_{BM} \tag{5}$$

$$(\sqrt{3}/2) \times W_{BM} \geq D \geq (1/2\sqrt{3}) \times (W_{BM} - W_{LD}) \tag{6}$$

$$0.95 \leq \text{(relative difference of values } (W_{LD}/D) \text{ among the pixels corresponding to the } R, G, \text{ and } B) \leq 1.05 \tag{7}$$

In the second display device according to an embodiment of the present invention, by satisfying the formula (4) to the formula (6) above, in the case where the opening dimension in the black matrix layer is larger than the photo-emission region dimension in the photo-emission element, within the range where the viewing angle is from 0° to 60° both inclusive, even in the case where vignetting of the display light from the photo-emission element occurs due to the light-shielding with the black matrix layer, the ratio of vignetting of the display light may be suppressed to equal to or less than 50%. Moreover, since the pixel size is different from each other among the pixels corresponding to R, G, and B, by adjusting the current density among the pixels corresponding to R, G, and B at the time of the display drive, the degree of deterioration due to aging may be approximately at the same level as each other. Moreover, by satisfying the formula (7) above, the color shift in accordance with the viewing angle, due to the difference of the vignetting state among the pixels corresponding to R, G, and B, is suppressed.

According to an embodiment of the present invention, there is provided a third display device including: a pair of substrates in which a plurality of pixels are disposed in a matrix form as a whole, the pixels being configured with pixels corresponding to R (red), G (green), or B (blue), and the pixels corresponding to the R, G, or B having size different from each other; a self-luminous photo-emission element formed in a region corresponding to each of the pixels, on one of the pair of substrates; and a black matrix layer formed in a region corresponding to between the pixels, on the other of the pair of substrates. Formula (8) to formula (11) below are satisfied, where $W_{BM}$ is an opening dimension in the black matrix layer, $W_{LD}$ is a photo-emission region dimension in the photo-emission element, and D is an air length between the photo-emission element and the black matrix layer.

$$2\sqrt{3} > (|W_{BM} - W_{LD}|/D) \tag{8}$$

$$W_{LD} \geq W_{BM} \tag{9}$$

$$(\sqrt{3}/2) \times W_{LD} \geq D \geq (1/2\sqrt{3}) \times (W_{LD} - W_{BM}) \tag{10}$$

$$0.95 \leq \text{(relative difference of values } (W_{BM}/D) \text{ among the pixels corresponding to the } R, G, \text{ and } B) \leq 1.05 \tag{11}$$

In the third display device according to an embodiment of the present invention, by satisfying the formula (8) to the formula (10) above, in the case where the opening dimension in the black matrix layer is equal to or smaller than the photo-emission region dimension in the photo-emission element, within the range where the viewing angle is from 0° to 60° both inclusive, even in the case where vignetting of the display light from the photo-emission element occurs due to the light-shielding with the black matrix layer, the ratio of vignetting of the display light may be suppressed to equal to or less than 50%. Moreover, since the pixel size is different from each other among the pixels corresponding to R, G, and B, by adjusting the current density among the pixels corresponding to R, G, and B at the time of the display drive, the degree of deterioration due to aging may be approximately at the same level as each other. Moreover, by satisfying the formula (11) above, the color shift in accordance with the viewing angle, due to the difference of the vignetting state among the pixels corresponding to R, G, and B, is suppressed.

According to the first display device of the embodiment of the present invention, since the self-luminous photo-emission element, and the black matrix layer are provided, and the formula (1) above is satisfied, vignetting of the display light from the photo-emission element, due to the light-shielding with the black matrix layer, does not occur at all, within the range where the viewing angle is from 0° to 60° both inclusive. Thereby, it is possible to improve the viewing angle characteristic of the luminance. Moreover, since the pixel size is different from each other among the pixels corresponding to R, G, and B, the degree of deterioration due to aging may be approximately at the same level as each other. Moreover, by satisfying the formula (2) or the formula (3) above, the color shift in accordance with the viewing angle may be suppressed. Therefore, in the display device including the self-luminous photo-emission element, it is possible to realize long service life of a whole panel, while improving display quality.

According to the second display device of an embodiment of the present invention, since the self-luminous photo-emission element, and the black matrix layer are provided, and the formula (4) to the formula (6) above are satisfied, in the case where the opening dimension in the black matrix layer is larger than the photo-emission region dimension in the photo-emission element, within the range where the viewing angle is from 0° to 60° both inclusive, even in the case where vignetting of the display light from the photo-emission element occurs due to the light-shielding with the black matrix layer, the ratio of vignetting of the display light may be suppressed to equal to or less than 50%. Thereby, it is possible to improve the viewing angle characteristic of the luminance. Moreover, since the pixel size is different from each other among the pixels corresponding to R, G, and B, the degree of deterioration due to aging may be approximately at the same level as each other. Moreover, by satisfying the formula (7) above, the color shift in accordance with the viewing angle may be suppressed. Therefore, in the display device including the self-luminous photo-emission element, it is possible to realize long service life of a whole panel, while improving display quality.

According to the third display device of an embodiment of the present invention, since the self-luminous photo-emission element, and the black matrix layer are provided, and the formula (8) to the formula (10) above are satisfied, in the case where the opening dimension in the black matrix layer is equal to or smaller than the photo-emission region dimension in the photo-emission element, within the range where the viewing angle is from 0° to 60° both inclusive, even in the case where vignetting of the display light from the photo-emission element occurs due to the light-shielding with the black matrix layer, the ratio of vignetting of the display light may be suppressed to equal to or less than 50%. Thereby, it is possible to improve the viewing angle characteristic of the luminance. Moreover, since the pixel size is different from each other among the pixels corresponding to R, G, and B, the degree of deterioration due to aging may be approximately at the same level as each other. Moreover, by satisfying the formula (11) above, the color shift in accordance with the viewing angle may be suppressed. Therefore, in the display device including the self-luminous photo-emission element, it is possible to realize long service life of a whole panel, while improving display quality.

Other and further objects, features and advantages of the invention will appear more fully from the following description.

DETAILED DESCRIPTION OF THE PREFERRED EMBODIMENTS

Figure 1:
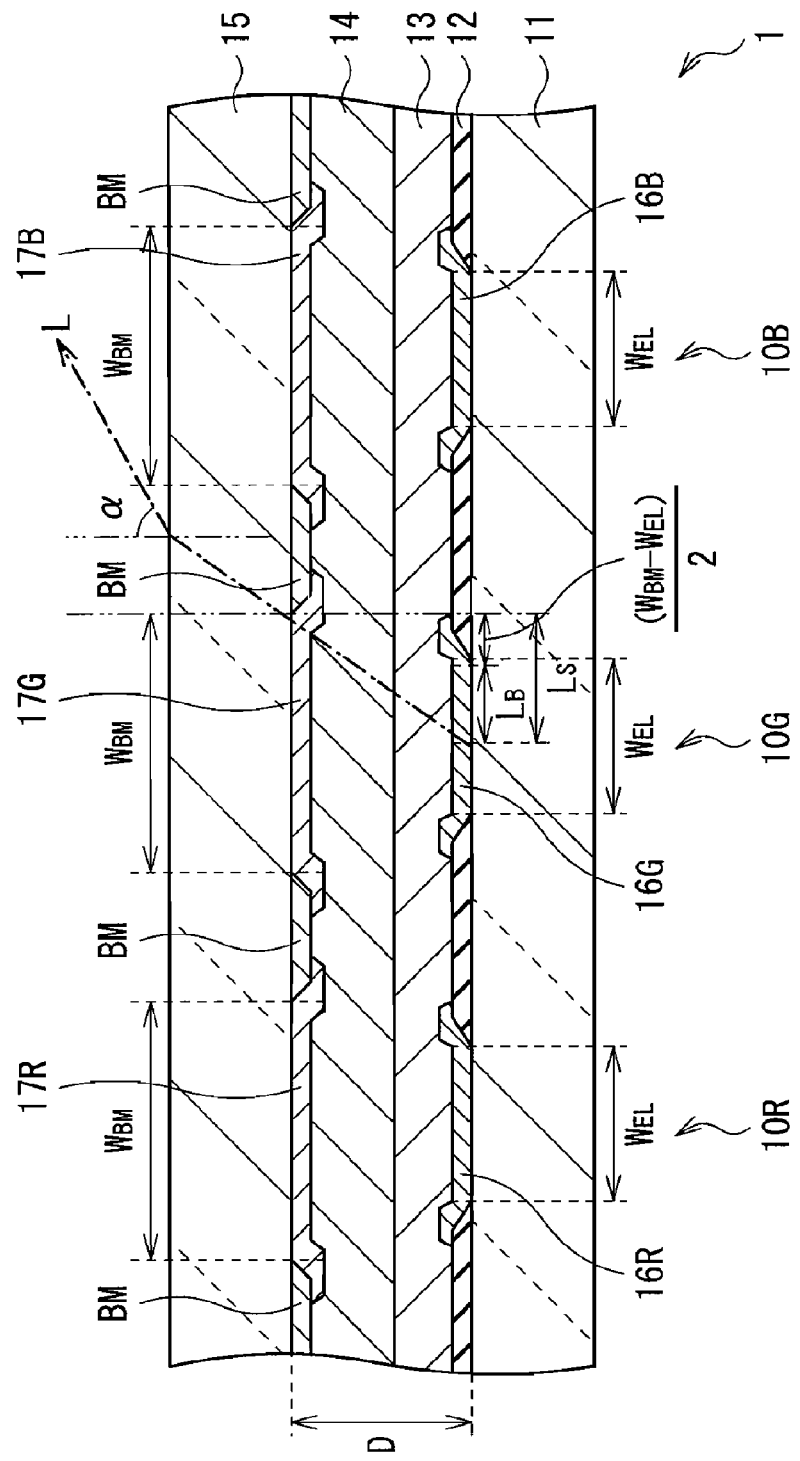
FIG. 1 is a cross-sectional view illustrating the configuration of a display device according to a first embodiment of the present invention.

Preferred embodiments of the present invention will be described in detail with reference to the accompanying drawings. The description will be made in the following order.
1. First embodiment (an example of the case where the dimension of an opening in a black matrix layer is larger than that of a photo-emission region in a photo-emission section)
2. Second embodiment (an example of the case where the dimension of the opening in the black matrix layer is equal to or smaller than that of the photo-emission region in the photo-emission section)
3. Modification First Embodiment Example of Whole Configuration of Display Device FIG. 1 illustrates the cross-sectional configuration of a display device (organic EL display device 1) according to a first embodiment of the present invention. In the organic EL display device 1, for example, on a substrate for drive 11 made of glass or the like, a plurality of photo-emission sections 16R, 16G, and 16B, which will be described later, are disposed in a matrix form in pixels 10R, 10G, and 10B, respectively. In the organic EL display device 1, a signal line drive circuit and a scanning line drive circuit (not illustrated in the figure) as pixel drive circuits for image display are formed. Specifically, between the substrate for drive 11 and a facing substrate 15, the photo-emission sections 16R, 16G, and 16B, an insulating layer 12, a protective layer 13, a sealing layer 14, color filter layers 17R, 17B, and 17G, and a black matrix layer BM are stacked in this order from the substrate for drive 11 side.

Figure 2:
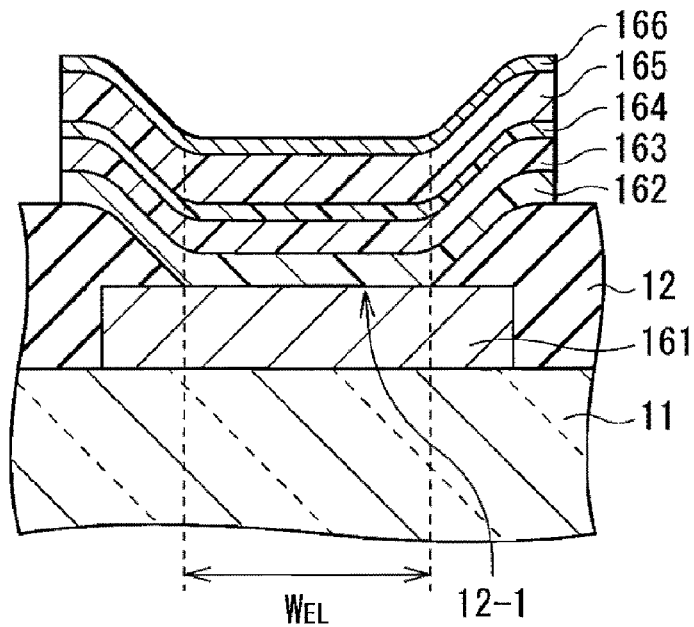
FIG. 2 is a cross-sectional view illustrating the detailed configuration of a photo-emission section illustrated in FIG. 1.

The photo-emission sections 16R, 16G, and 16B are formed in regions corresponding to the pixels 10R, 10G, and 10B, respectively, and made of self-luminous photo-emission elements (organic EL elements) emitting light in a red wavelength region, a green wavelength region, and a blue wavelength region, respectively. FIG. 2 illustrates the detailed cross-sectional configuration of the organic EL element. In the organic EL element, a drive transistor (not illustrated in the figure) in the above-described pixel drive circuit, a first electrode 161, a hole injection layer 162 as being an organic layer, a hole transport layer 163, a photo-emission layer 164 and an electron transport layer 165, and a second electrode 166 are stacked in this order from the substrate for drive 11 side. Among them, the first electrode 161 serves as an anode, and the second electrode 166 serves as a cathode.

Such an organic EL element is covered with the protective layer 13 made of silicon nitride (SiNx) or the like. Moreover, the facing substrate 15 made of glass or the like is bonded to the whole surface of this protective layer 13 with the sealing layer 14 in between, thereby the organic EL element is sealed.

The drive transistor is electrically connected to the first electrode 161 through an opening 12-1 provided in the insulating film 12.

The first electrode 161 is made of, for example, ITO (indium-tin composite oxide).

As described above, the organic layers in each of the photo-emission sections 16R, 16G, and 16B has the configuration in which the hole injection layer 162, the hole transport layer 163, the photo-emission layer 164, and the electron transport layer 165 are stacked in this order from the first electrode 161 side. However, among them, the layers except for the photo-emission layer 164 may be provided, if necessary. Moreover, such organic layers may have the configurations different from each other depending on the photo-emission color of the organic EL element. The hole injection layer 162 improves the hole injection efficiency, and also serves as a buffer layer preventing leakage. The hole transport layer 163 improves the hole transportation efficiency to the photo-emission layer 164. Recombination of an electron and a hole occurs by application of electric field, thereby the photo-emission layer 164 generates light. As will be described later in detail, the photo-emission layer 164 contains host material having an electron transportation characteristic, and dopant material (guest material) having a photo-emission characteristic. The electron transport layer 165 improves the electron transportation efficiency to the photo-emission layer 164. Between the electron transport layer 165 and the second electrode 166, for example, an electron injection layer (not illustrated in the figure) made of LiF, $Li_2O$, or the like with the thickness of approximately 0.3 nm may be provided.

For example, the hole injection layer 162 in the photo-emission section 16R has the thickness of 5 nm or more and 300 nm or less, and is made of 4,4',4"-tris(3-methyl-phenyl-phenyl-amino)triphenylamine (m-MTDATA), or 4,4',4"-tris(2-naphthylphenylamino)triphenylamine (2-TNATA). For example, the hole transport layer 163 in the photo-emission section 16R has the thickness of 5 nm or more and 300 nm or less, and is made of bis[(N-naphthyl)-N-phenyl]benzidine (α-NPD). For example, the photo-emission layer 164 in the photo-emission section 16R has the thickness of 10 nm or more and 100 nm or less, and is composed by mixing 30 weight % of 2,6-bis[4'-methoxydiphenylamino)styryl]-1,5-dicyanonaphthalene (BSN) as the dopant material into 9,10-di-(2-naphthyl)anthracene (ADN) as the host material. For example, the electron transport layer 165 in the photo-emission section 16R has the thickness of 5 nm or more and 300 nm or less, and is made of 8-hydroxyquinoline aluminum ($Alq_3$).

For example, the hole injection layer 162 in the photo-emission section 16G has the thickness of 5 nm or more and 300 nm or less, and is made of m-MTDATA or 2-TNATA. For example, the hole transport layer 163 in the photo-emission section 16G has the thickness of 5 nm or more and 300 nm or less, and is made of α-NPD. For example, the photo-emission layer 164 in the photo-emission section 16G has the thickness of 10 nm or more and 100 nm or less, and is composed by mixing 5 volume % of Coumarin 6 as the dopant material into ADN as the host material. For example, the electron transport layer 165 in the photo-emission section 16G has the thickness of 5 nm or more and 300 nm or less, and is made of $Alq_3$.

For example, the hole injection layer 162 in the photo-emission section 16B has the thickness of 5 nm or more and 300 nm or less, and is made of m-MTDATA or 2-TNATA. For example, the hole transport layer 163 in the photo-emission section 16B has the thickness of 5 nm or more and 300 nm or less, and is made of α-NPD. For example, the photo-emission layer 164 in the photo-emission section 16B has the thickness of 10 nm or more and 100 nm or less, and is composed by mixing 2.5 weight % of 4,4'-bis[2-{4-(N,N-diphenylamino)phenyl}vinyl]biphenyl (DPAVBi) as the dopant material into ADN as the host material. For example, the electron transport layer 165 in the photo-emission section 16B has the thickness of 5 nm or more and 300 nm or less, and is made of $Alq_3$.

For example, the second electrode 166 has the thickness of 5 nm or more and 50 nm or less, and is made of a metal element such as aluminum (Al), magnesium (Mg), calcium (Ca), and sodium (Na), or an alloy of these metal elements. Among them, an alloy of magnesium and silver (MgAg alloy), or an alloy of aluminum (Al) and lithium (Li) (AlLi alloy) is preferable.

The insulating layer 12 planarizes the surface of the substrate for drive 11, and is made of, for example, organic material such as polyimide, or inorganic material such as silicon oxide ($SiO_2$).

The protective layer 13 prevents moisture infiltration into the organic layers in the photo-emission sections 16R, 16G, and 16B. The protective layer 13 is made of material having low water permeability and low water absorbability, and has the sufficient thickness. The protective layer 13 has high permeability to light generated in the photo-emission layer 164, and is made of, for example, material having permeability of 80% or more. For example, such a protective layer 13 has the thickness of approximately 2 µm to 3 µm, and is made of inorganic amorphous insulating material. Specifically, amorphous silicon (α-Si), amorphous silicon carbide (α-SiC), amorphous silicon nitride (α-$Si_{1-x}N_x$), and amorphous carbon (α-C) are preferable. The inorganic amorphous insulating material described above does not configure a grain. Thus, the inorganic amorphous insulating material has low water permeability, and the favorable protective layer 13 may be made therewith. The protective layer 13 may be made of transparent conductive material such as ITO.

The sealing layer 14 is made of, for example, thermoset resin or ultraviolet curing resin.

The facing substrate 15 is located on the second electrode 166 side from the photo-emission sections 16R, 16G, and 16B, and seals the photo-emission sections 16R, 16G, and 16B, in cooperation with the sealing layer 14. The facing substrate 15 is made of, for example, material such as glass which is transparent to the light generated in the photo-emission sections 16R, 16G, and 16B. On the facing substrate 15, for example, the color filter layers 17R, 17G, and 17B are provided. Thereby, the light generated in the photo-emission sections 16R, 16G, and 16B is extracted, and natural light reflected with the photo-emission sections 16R, 16G, and 16B, and wiring between the photo-emission sections 16R, 16G, and 16B is absorbed, thereby the contrast improves. In the facing substrate 15, the black matrix layer BM which will be described later is also provided.

The color filter layer is configured with the color filter layer 17R as a red filter, the color filter layer 17G as a green filter, and the color filter layer 17B as a blue filter, and is disposed for each of the pixels, corresponding to the photo-emission sections 16R, 16G, and 16B. The color filter layers 17R, 17G, and 17B are, for example, formed in rectangular shapes without gaps in between. The color filter layers 17R, 17G, and 17B are made of resin into which pigment is mixed. By selecting the pigment, the color filter layers 17R, 17G, and 17B are adjusted so as to have high light-permeability in a desired wavelength region of red, green or blue, and low light-permeability in other wavelength regions, respectively.

The black matrix layer BM is formed in a region corresponding to between the pixels 10R, 10G, and 10B. The black matrix layer BM divides display regions of the pixels 10R, 10G, and 10B. The black matrix layer BM prevents reflection of the natural light at a boundary of regions of each of the colors, and prevents light leakage among the pixels, thereby improving the contrast. The black matrix layer BM is configured by stacking thin film layers made of metal, metal oxide, and metal nitride. Specifically, the black matrix layer BM is made of, for example, a two-layered chrome black matrix by stacking $CrO_x$ (x is an arbitrary number) and Cr, or a three-layered chrome black matrix by stacking $CrO_x$, $CrN_y$ and Cr (x and y are arbitrary numbers).

Example of Detailed Configuration of Display Device

Next, with reference to FIGS. 1 to 7, the configuration of a characteristic part according to the first embodiment of the present invention, and operation and effects brought by the configuration of the characteristic part will be described in detail.

Case Where No Vignetting Occurs

In the organic EL display device 1 according to the first embodiment, Formula (21) below is satisfied so as to prevent reduction in the light use efficiency caused by covering the photo-emission region. Here, as illustrated in FIG. 1, the dimension of the opening in the black matrix layer BM is expressed as $W_{BM}$. The dimension of the photo-emission region in the organic EL element in each of the photo-emission sections 16R, 16G, and 16B is expressed as $W_{EL}$ (corresponding to a specific example of a photo-emission region dimension $W_{LD}$). Moreover, the distance in the vertical direction between each of the photo-emission sections 16R, 16G, and 16B (organic EL elements) and the black matrix layer BM is converted into the air length, and expressed as D ($=\Sigma di/ni$). That is, in the organic EL display device 1, the opening dimension $W_{BM}$ in the black matrix layer BM is larger than the photo-emission region dimension $W_{EL}$ in the organic EL element, in the dimensional relationship between the the opening dimension $W_{BM}$ in the black matrix layer BM, and the photo-emission region dimension $W_{EL}$ in the organic EL element. The difference value between the opening dimension $W_{BM}$ in the black matrix layer BM and the photo-emission region dimension $W_{EL}$ in the organic EL element is desirably twice the dimension of a margin generated when the facing substrate 15 and the substrate for drive 11 are superposed on each other.

$$W_{BM}-W_{EL}>0 \qquad (21)$$

Here, as illustrated in FIG. 1, it is assumed that a display image in the organic EL display device 1 is observed in the air from the direction forming an angle α (viewing angle α) with respect to the facing substrate 15. In that case, from Snell's law, a length $L_S$ of a shadow region formed on each of the photo-emission sections 16R, 16G, and 16B due to the light-shielding with the black matrix layer BM is expressed with Formula (22) below. Moreover, a dimension $L_B$ of a region actually light-shielded with a portion of this shadow region is expressed with Formula (23) below.

$$L_S = D \times \tan\alpha \qquad (22)$$

$$L_B = L_S - (1/2) \times (W_{BM} - W_{EL}) \qquad (23)$$
$$D \times \tan\alpha - 0.5 \times (W_{BM} - W_{EL})$$

Therefore, when Formula (24) below is satisfied, there is no region actually light-shielded due to the light-shielding with the black matrix layer BM. Thereby, within the range where the viewing angle is from 0° to α, vignetting of a display light L from the organic EL element, due to the light-shielding with the black matrix layer BM, does not occur at all. Moreover, when Formula (24) is modified, it is expressed as Formula (25). As one of the conditions to satisfy Formula (24) and Formula (25), there is a case where the black matrix layer BM is formed immediately above each of the photo-emission sections 16R, 16G, and 16B.

$$L_B = D \times \tan\alpha - 0.5 \times (W_{BM}-W_{EL}) \leq 0 \qquad (24)$$

$$\alpha \leq \tan^{-1}((W_{BM}-W_{EL})/(2 \times D)) \qquad (25)$$

In a typical display device, even when vignetting occurs at the viewing angle α of 60° or more, it is thought that this is practically not a serious issue. Here, α is set to 60° because of the following reason. As an example, in the case where the optimal viewing distance is twice the width of the display device, and there is a viewer in the direction of 45° from the front face of the display screen, the viewer views the display screen at an angle range of (45°±15°) as an angle of view, at the same time. In this case, it is thought that the maximum angle 60° is not a deal of a mere mathematical formula, but is an angle to be reference for one skilled in the art. Therefore, when α=60° is substituted in Formula (24) and Formula (25), Formula (26) below is established.

$$2\sqrt{3} \leq (W_{BM}-W_{EL})/D \qquad (26)$$

In the case where the aperture ratio is small (the case where the value of ($W_{BM}-W_{EL}$) is large), it means that the film thickness of the protective layer 13 and the sealing layer 14 is excessively thin. Therefore, in consideration of reduction in the service life due to the increase in the current density, and the heat resistance in the process, the aperture ratio is desirably as large as possible (the value of ($W_{BM}-W_{EL}$) is as small as possible).

In such an organic EL display device 1, with the drive signal supplied from the pixel drive circuit which is not illustrated in the figure, the drive current flows between the first electrode 161 and the second electrode 166 in the organic EL element in each of the photo-emission sections 16R, 16G, and 16B. As a result, a hole and an electron recombine, and the photo-emission occurs in the photo-emission layer 164. The light from the photo-emission layer 164 transmits the second electrode 166, the protective layer 13, the sealing layer 14, the color filter layers 17R, 17G, and 17B, and the facing substrate 15, and is extracted to outside the display device. Thereby, the image display based on the drive signal is performed.

Here, by satisfying Formula (21) and Formula (26) above, within the range where the viewing angle α is from 0° to 60°, vignetting of the display light L from the photo-emission sections 16R, 16G, and 16B (organic EL elements), due to the light-shielding with the black matrix layer BM, does not occur at all.

However, in the case of the self-luminous element such as the organic EL element, the degree of the deterioration of the element due to aging is varied depending on the photo-emission color of the element. Thus, in the case where the aperture ratio is identical among the pixels corresponding to R, G, and B, with elapse of the time, the luminance differs from each other in each of the colors, and the color shift phenomenon occurs.

Figure 3:
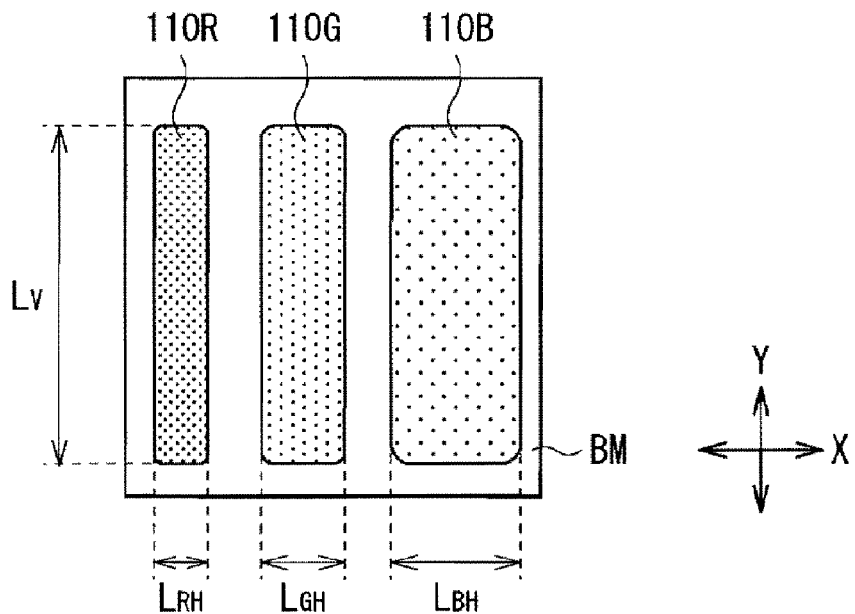
FIG. 3 is a plan view illustrating the shape of a pixel according to a comparative example for explaining color shift phenomenon.
Figure 4:
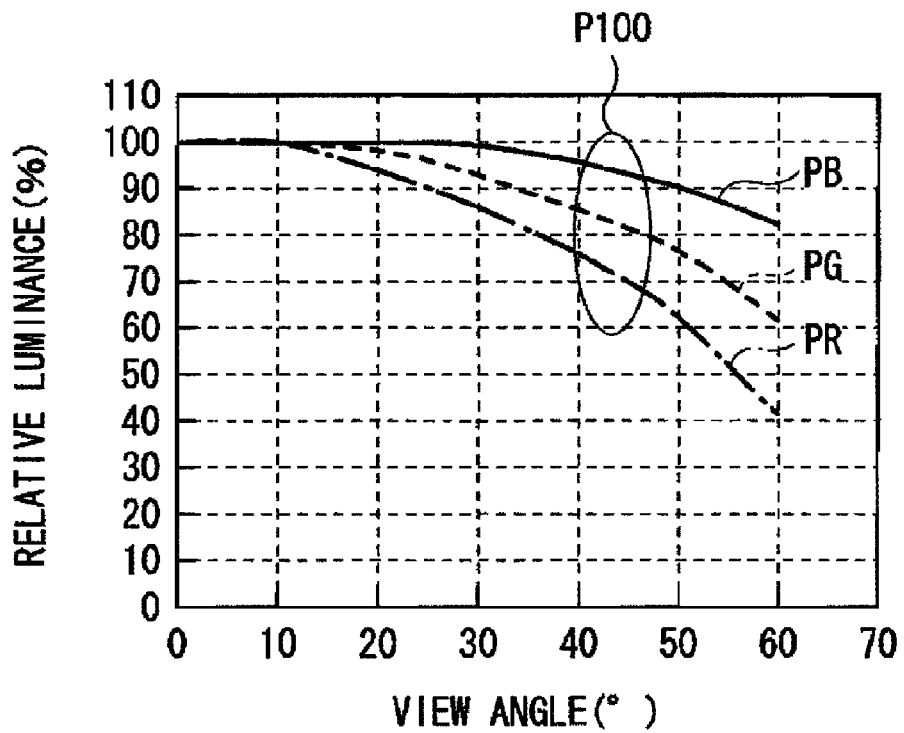
FIG. 4 is a characteristic view illustrating an example of the relationship between a viewing angle and a relative luminance, in the case of the pixel shape illustrated in FIG. 3.

Thus, for example, like pixels 110R, 110G, and 110B illustrated in FIG. 3, it is thought to make the aperture ratio (pixel size) different from each other among the pixels corresponding to each of the colors. Here, opening dimensions $L_v$ in the black matrix layers BM in the vertical direction (Y-axis direction) are equal to each other in each of the colors. On the other hand, opening dimensions $L_{RH}$, $L_{GH}$, and $L_{BH}$ in the black matrix layers BM in the horizontal direction (X-axis direction) are different from each other in each of the colors ($L_{RH}$<$L_{GH}$<$L_{BH}$). In the case of such a configuration, by adjusting the current density for each color at the time of the display drive, the deterioration curve (degree of deterioration) due to aging may be approximately at the same level in each of the colors.

However, in the case where the aperture ratio differs from each other among the pixels corresponding to each of the colors, since the opening dimension differs from each other in each of the colors, the state of vignetting also differs from each other among the pixels corresponding to in each of the colors. Accordingly, for example, as indicated with reference numeral P100 in FIG. 4, luminance PR, PG, and PB (light intensity balance) of each of the colors differs from each other in accordance with the viewing angle, and thereby the so-called color shift phenomenon is brought. In the case where such a color shift phenomenon occurs, the display quality is deteriorated, even when Formula (21) and Formula (26) are satisfied, and the viewing angle characteristic of the luminance improves.

Thus, in the organic EL display device 1 according to the first embodiment, as described above, the pixel size differs from each other in the pixels 10R, 10G, and 10B so that the degree of the deterioration due to aging is at the same level in each of the colors. In addition to Formula (21) and Formula (26) above, Formula (27) below is also satisfied. That is, by adjusting one or both of the shape of the opening in the pixel, and the air length D(=Σ di/ni) between each of the photo-emission sections 16R, 16G, and 16B, and the black matrix layer BM, the ratio of the luminance reduction in accordance with the viewing angle is suppressed to within ±5% in each of the colors, and the color shift phenomenon is suppressed. Thereby, the color shift in accordance with the viewing angle, due to the difference of the state of vignetting in the pixels 10R, 10G, and 10B is suppressed (for example, within the range where the viewing angle α is equal to or smaller than 60°, a viewing angle chromaticity shift Δuv equal to or smaller than 0.020 is satisfied).

$$0.95 \leq \text{(relative difference of the values } (W_{EL}/D) \text{ among the pixels } 10R, 10G, \text{ and } 10B) \leq 1.05 \quad (27)$$

Figure 5:
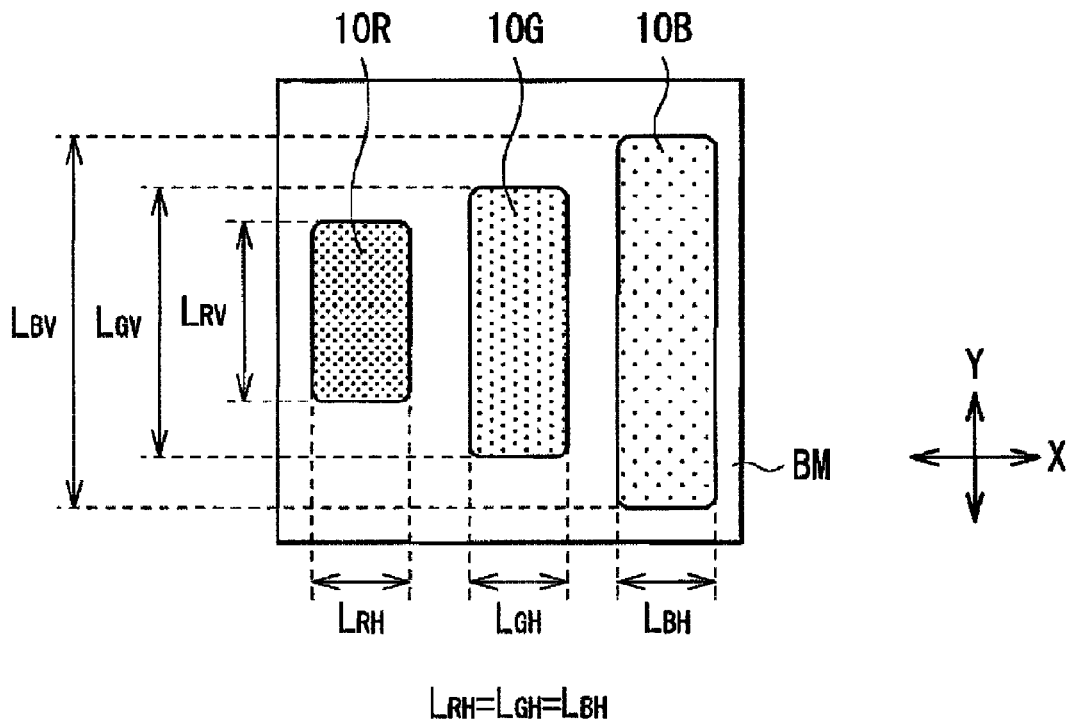
FIG. 5 is a plan view illustrating an example of the pixel shape illustrated in FIG. 1.

Specifically, for example, in the pixels 10R, 10G, and 10B illustrated in FIG. 5, the air lengths D between the photo-emission sections 16R, 16G, and 16B, and the black matrix layers BM are equal to each other. On the other hand, the opening dimensions $L_{RV}$, $L_{GV}$, and $L_{BV}$ in the black matrix layers BM in the vertical direction (Y-axis direction) differ from each other in each of the colors ($L_{RV}$<$L_{GV}$<$L_{BV}$). Moreover, the opening dimensions $L_{RB}$, $L_{GH}$, and $L_{BH}$ in the black matrix layers BM in the horizontal direction (X-axis direction) are equal to each other in each of the colors ($L_{RH}$=$L_{GH}$=$L_{BH}$). Thereby, Formula (27) above is satisfied with the dimensions $L_{RH}$, $L_{GH}$, and $L_{BH}$ in the horizontal direction. This is because, by taking into consideration that the visibility with respect to the horizontal direction is typically high in the viewing direction, the color shift phenomenon is generated along the vertical direction, while the color shift phenomenon is not generated along the horizontal direction.

Figure 6:
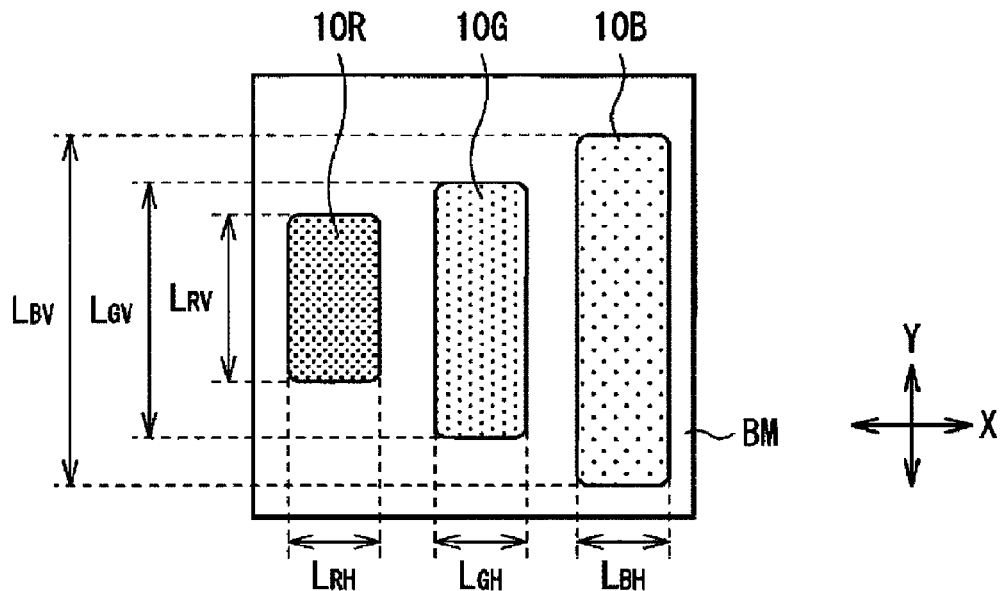
FIG. 6 is a plan view illustrating another example of the pixel shape illustrated in FIG. 1.

For example, in the pixels 10R, 10G, ad 10B illustrated in FIG. 6, the air lengths D between the photo-emission sections 16R, 16G, and 16B, and the black matrix layers BM are equal to each other in each of the colors. On the other hand, the opening dimensions $L_{RB}$, $L_{GH}$, and $L_{BH}$ in the black matrix layers BM in the horizontal direction (X-axis direction) are different from each other in each of the colors ($L_{RB}$<$L_{GH}$<$L_{BH}$), and the opening dimensions $L_{RV}$, $L_{GV}$, and $L_{BV}$ in the black matrix layers BM in the vertical direction (Y-axis direction) are different from each other in each of the colors ($L_{RV}$<$L_{GV}$<$L_{BV}$). Formula (27) above is satisfied with the dimensions $L_{RH}$, $L_{GH}$, and $L_{BH}$ in the horizontal direction. Thereby, in addition to the color shift phenomenon along the horizontal direction, the color shift phenomenon along the vertical direction is also suppressed.

Case Where Vignetting Occurs

Next, the case is considered where there is a region actually light-shielded due to the light-shielding with the black matrix layer BM, within the angle range equal to or smaller than the viewing angle α. In other words, this is the case where vignetting of the display light L from the photo-emission sections 16R, 16G, and 16B (organic EL elements) occurs due to the light-shielding with the black matrix layer BM. Many of the actual display devices correspond to this condition, and this may be thought as more practical solution. In this case, in consideration of Formula (24) and Formula (25) above, Formula (28) and Formula (29) are established. Similarly to the above-described case, when α=60° is substituted in Formula (28) and Formula (29), Formula (30) below is established.

$$LB = D \times \tan \alpha - 0.5 \times (W_{BM} - W_{EL}) > 0 \quad (28)$$

$$\alpha > \tan^{-1}((W_{BM} - W_{EL})/(2 \times D)) \quad (29)$$

$$2\sqrt{3} > (W_{BM} - W_{EL})/D \quad (30)$$

Here, the ratio of vignetting of the display light L, due to the light-shielding with the black matrix layer BM (ratio where the display light L is light-shielded) is proportional to the ratio between the dimension $L_B$ of the region actually light-shielded with the portion of the shadow region, and the photo-emission region dimension $W_{EL}$ in the organic EL element. Thus, the ratio of vignetting of the display light L is expressed with Formula (31) below. That is, Formula (32) below may be satisfied so that the ratio of vignetting of the display light L is equal to or less than 50%. When Formula (32) is modified by using Formula (28), Formula (33) below is established.

$$\text{Ratio of vignetting of the display light } L = (L_B/W_{EL}) \quad (31)$$

$$0.5 \geq (L_B/W_{EL}) \geq 0 \quad (32)$$

$$0.5 \times W_{BM} \geq D \times \tan \alpha \geq 0.5 \times (W_{BM} - W_{EL}) \quad (33)$$

Here, in the case where vignetting of the display light L occurs as described above, when considering the application range of the viewing angle α, the viewing angle α may be small to a certain level, in the application of a mobile device such as a cell-phone. On the other hand, the viewing angle α is necessarily large to a certain level, in the application of a TV or the like. In consideration of this point, as the application range of the viewing angle α, the reasonable numerical value range is from 30° to 60°. When this is applied to Formula (33), Formula (34) below is established.

$$(\sqrt{3}/2) \times W_{BM} \geq D \geq (1/2\sqrt{3}) \times (W_{BM} - W_{EL}) \quad (34)$$

In such an organic EL display device 1, by satisfying Formula (21), Formula (30) and Formula (34) above, in the case where the opening dimension $W_{BM}$ in the black matrix layer BM is larger than the photo-emission region dimension $W_{EL}$ in each of the photo-emission sections 16R, 16G, and 16B, it may be said as follows. That is, within the range where the viewing angle α is from 0° to 60° both inclusive, even in the case where vignetting of the display light L from the organic EL element occurs due to the light-shielding with the black matrix layer BM, the ratio of vignetting of the display light L may be suppressed to equal to or less than 50%.

Figure 7:
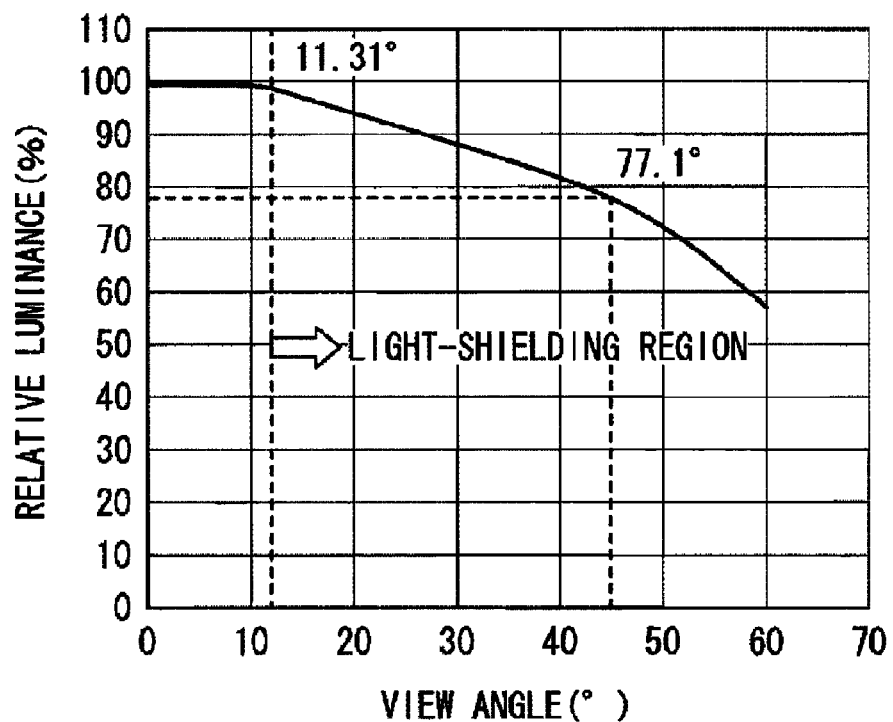
FIG. 7 is a characteristic view illustrating an example of the relationship between the viewing angle and the relative luminance in the display device illustrated in FIG. 1.

FIG. 7 illustrates an example of the relationship between the viewing angle α and the relative luminance (relative luminance in the case where the luminance when the viewing angle α is 0° is regarded as 100%) in the organic EL display device 1. Here, the pixel pitch of each of the pixels 10R, 10G and 10B is 100 μm. The opening dimension $W_{BM}$ in the black matrix layer BM is 70 μm. The photo-emission region dimension $W_{EL}$ in each of the photo-emission sections 16R, 16G and 16B (organic EL elements) is 60 μm. The air length D (=Σ di/ni) between each of the photo-emission sections 16R, 16G, and 16B and the black matrix layer BM is 30 μm in actual thickness. Here, when an average refraction index "n" between each of the photo-emission sections 16R, 16G, and 16B and the black matrix layer BM is 1.6, the viewing angle α at which vignetting of the display light L starts to be generated due to the light-shielding with the black matrix layer BM is 11.31°. That is, it is understood that the light-shielding (vignetting of the display light L) starts to be generated from a considerably low-angle region, and the relative luminance is reduced to 77.1% when the viewing angle α is 45°.

Also in this case, for example, as illustrated in FIG. 5 or FIG. 6, the pixel size differs from each other in the pixels 10R, 10G, and 10B so that the degree of the deterioration due to aging is at the same level as each other in each of the colors. In addition to Formula (21), Formula (30), and Formula (34) above, Formula (27) above is also satisfied. Thereby, similarly to the case described above, the color shift in accordance with the viewing angle, due to the difference in the vignetting state in the pixels 10R, 10G, and 10B is suppressed (for example, within the range where the viewing angle α is equal to or smaller than 60°, the viewing angle chromaticity shift Δuv equal to or smaller than 0.020 is satisfied).

As described above, in the first embodiment, in the case where the organic EL element (photo-emission sections 16R, 16G, and 16B) as the self-luminous photo-emission element, and the black matrix layer BM are provided, and Formula (21) and Formula (26) above are satisfied, vignetting of the display light L from the photo-emission sections 16R, 16G, and 16B (organic EL elements), due to the light-shielding with the black matrix layer BM, does not occur at all, within the range where the viewing angle α is from 0° to 60° both inclusive. Thereby, it is possible to improve the viewing angle characteristic of the luminance. Moreover, since the pixel size differs from each other in the pixels 10R, 10G, and 10B, the degree of the deterioration due to aging may be at the same level as each other. Moreover, since Formula (27) above is satisfied, it is possible to suppress the color shift in accordance with the viewing angle. Therefore, in the display device including the self-luminous photo-emission element, it is possible to realize long service life of the whole panel, while improving the display quality.

Here, the case is described where the organic EL element (photo-emission sections 16R, 16G, and 16B) as the self-luminous photo-emission element and the black matrix layer BM are provided, and Formula (21), Formula (30), and Formula (34) above are satisfied. In the case where the opening dimension $W_{BM}$ in the black matrix layer BM is larger than the photo-emission region dimension $W_{EL}$ of each of the photo-emission sections 16R, 16G, and 16B (organic EL elements), even when vignetting of the display light L from the organic EL element, due to the light-shielding with the black matrix layer BM, occurs within the range where the viewing angle α is from 0° to 60° both inclusive, the ratio of vignetting of the display light L is suppressed to equal to or less than 50%, and it is possible to improve the viewing angle characteristic of the luminance. Moreover, since the pixel size differs from each other in the pixels 10R, 10G, and 10B, the degree of the deterioration due to aging may be at the same level as each other. Moreover, since Formula (27) above is satisfied, it is possible to suppress the color shift in accordance with the viewing angle. Therefore, in the display device including the self-luminous photo-emission element, it is possible to realize long service time of the whole panel, while improving the display quality.

Figure 8:
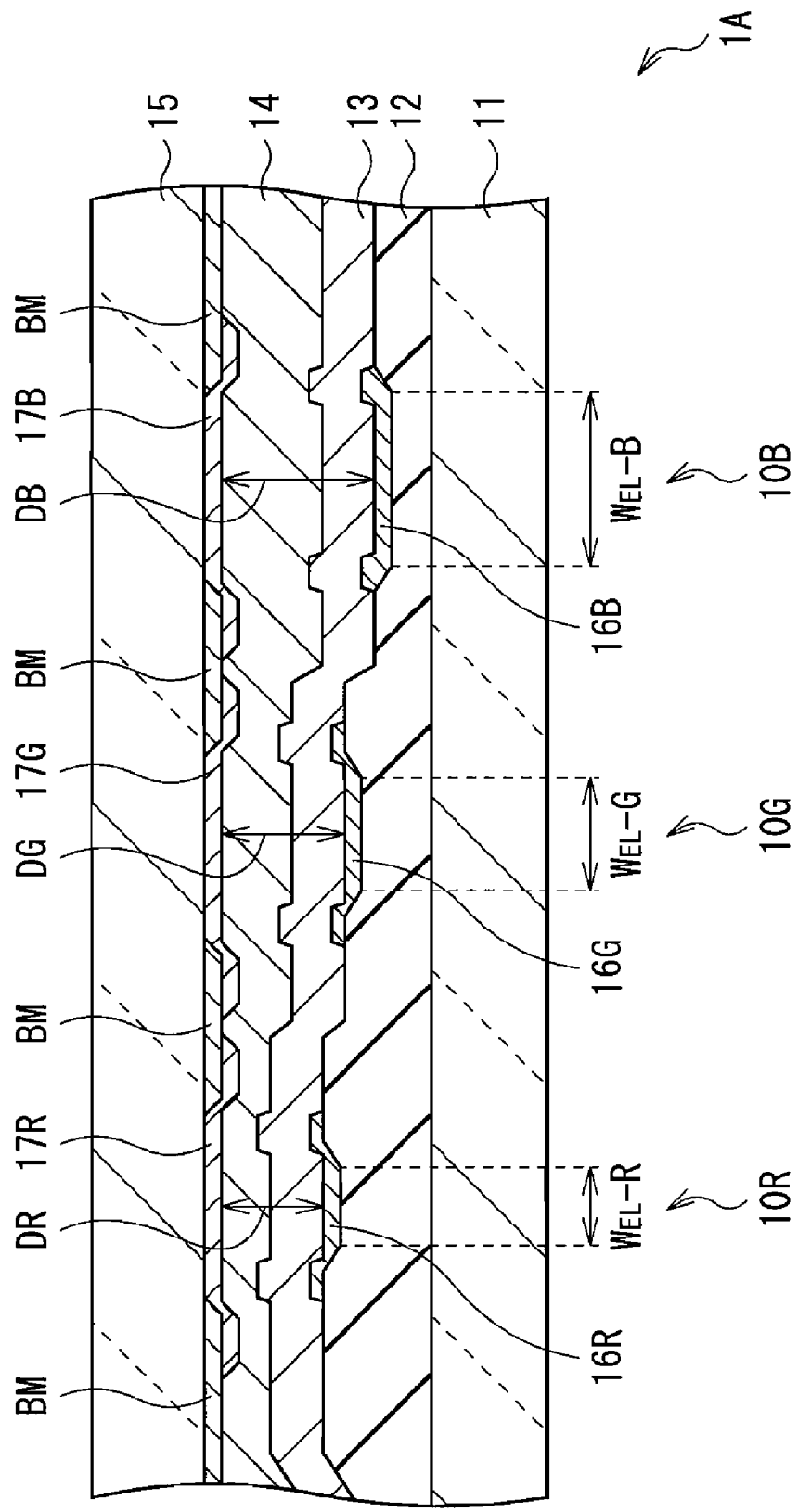
FIG. 8 is a cross-sectional view illustrating the configuration of the display device according to a modification of the first embodiment.

For example, like an organic EL display device 1A illustrated in FIG. 8, by providing steps in the positions of the photo-emission sections 16R, 16G, and 16B, the air length D between each of the photo-emission sections 16R, 16G, and 16B and the black matrix layer BM may differ from each other in each of the colors. Here, it may be expressed as follows: an air length DR in the pixel 10R<an air length DG in the pixel 10G<an air length DB in the pixel 10B. Such a configuration is effective in the case where Formula (27) above may not be satisfied in the opening dimension in the black matrix layer BM in the horizontal direction (X-axis direction) and the vertical direction (Y-axis direction). In such a case where the air length D differs from each other in each of the colors (for example, the case where the relative difference of the air lengths D is within ±5% in each of the colors), the values of $W_{EL}$ in Formula (27) may be equal to each other in each of the colors. The configuration illustrated in FIG. 8 may be combined with the configurations illustrated in FIGS. 5 and 6.

Figure 9:
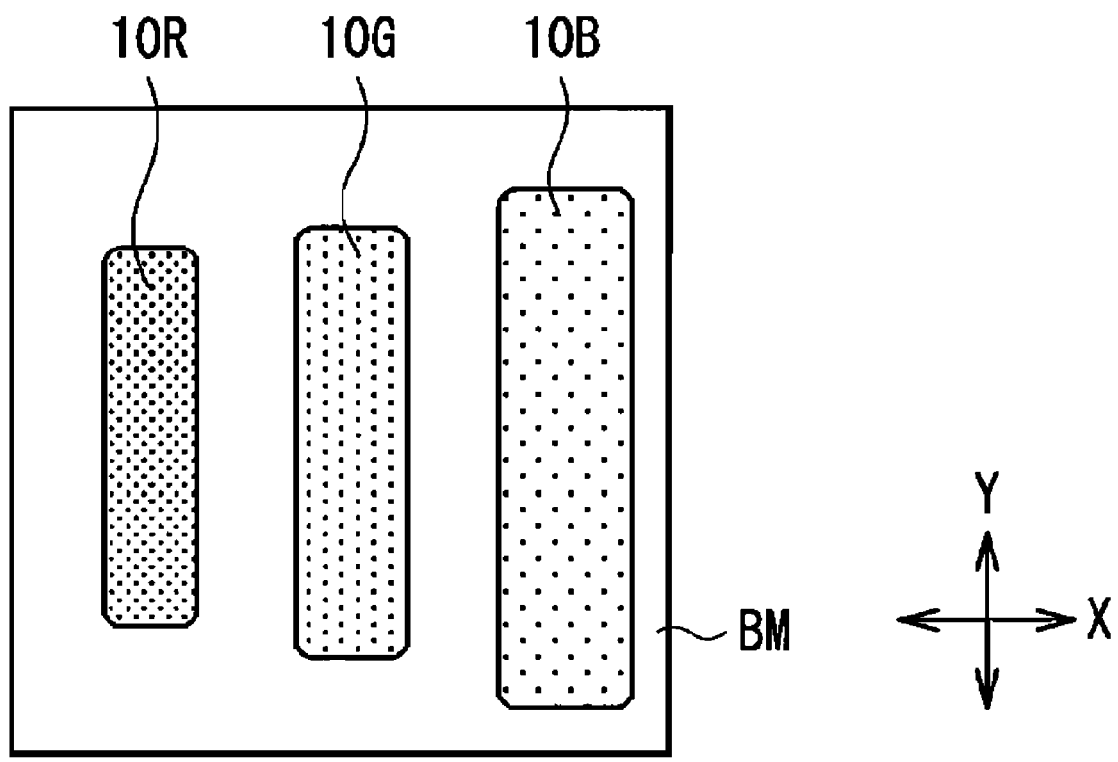
FIG. 9 is a plan view illustrating the pixel shape according to another modification of the first embodiment.

For example, as illustrated in FIG. 9, the air length D between each of the photo-emission sections 16R, 16G, and 16B, and the black matrix layer BM may differ from each other in each of the colors similarly to the above, and the shape of the openings may be similar to each other in the pixels 10R, 10G, and 10B. In the case of such a configuration, it is possible to suppress the chromaticity viewing angle characteristic due to vignetting from all directions.

Second Embodiment

Next, a second embodiment of the present invention will be described. Same reference numerals as in the first embodiment are used to indicate substantially identical components, thereby the description is appropriately omitted.

Example of Whole Configuration of Display Device

Figure 10:
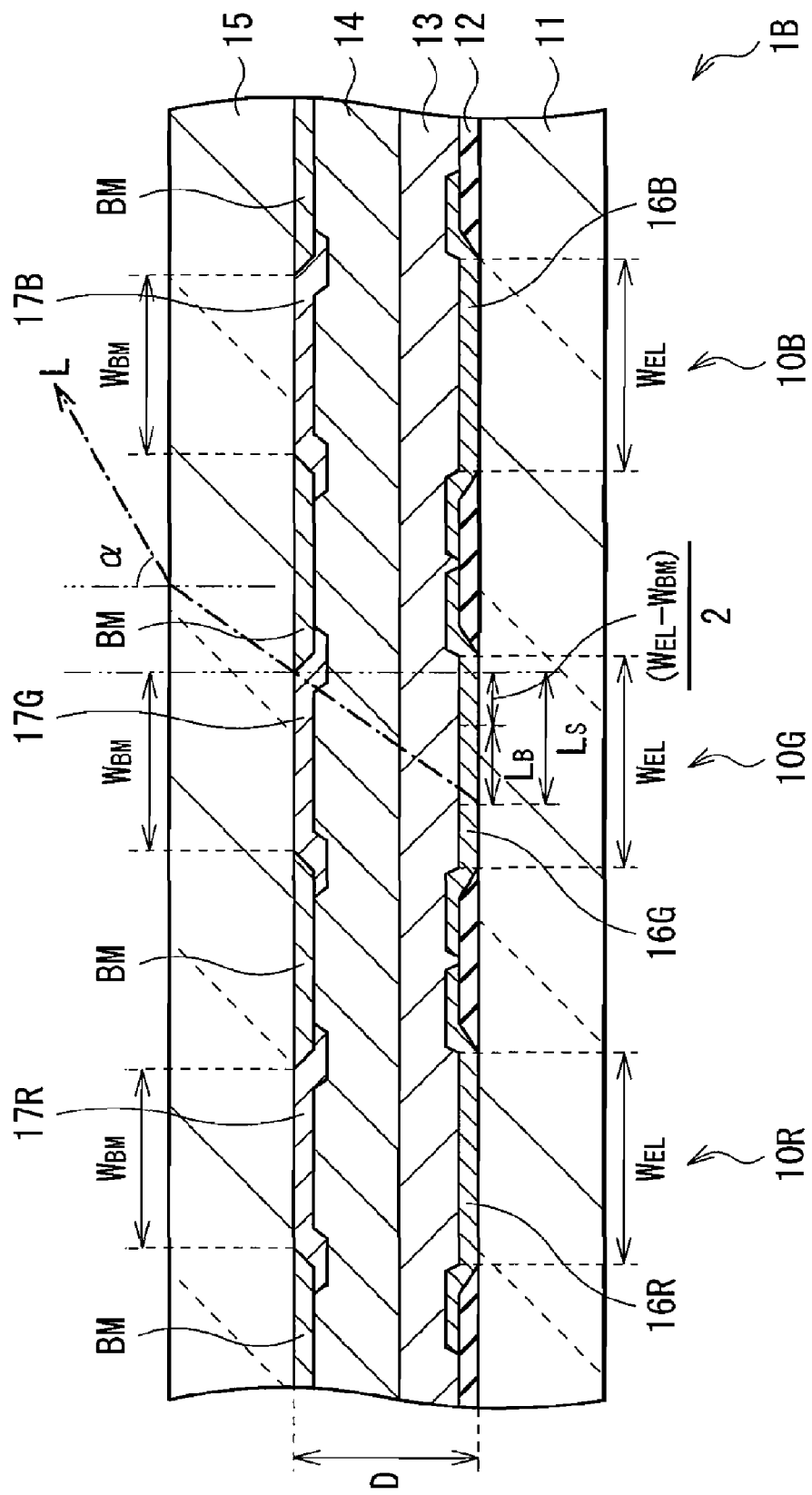
FIG. 10 is a cross-sectional view illustrating the configuration of the display device according to a second embodiment.

FIG. 10 illustrates the cross-sectional configuration of a display device (organic EL display device 1B) according to the second embodiment of the present invention. The organic EL display device 1B differs from the organic EL display device 1 of the first embodiment in that the opening dimension $W_{BM}$ in the black matrix layer BM is equal to or smaller the photo-emission region dimension $W_{EL}$ (corresponds to a specific example of the photo-emission region dimension $W_{LD}$) in each of the photo-emission sections 16R, 16G, and 16B. This case corresponds to the case where there are almost no issues in service life and electric power consumption of the organic EL element. That is, in the organic EL display device 1B according to the second embodiment, Formula (35) below is satisfied.

$$W_{BM} - W_{EL} \leq 0 \tag{35}$$

The overlapping amount as being the difference value ($W_{EL} - W_{BM}$) between the photo-emission region dimension $W_{EL}$ in the organic EL element and the opening dimension $W_{BM}$ in the black matrix layer BM is preferably twice the dimension of the margin generated when the facing substrate 15 and the substrate for drive 11 are superposed on each other. In the second embodiment, the light-shielding on the front side is generated also in the position where the viewing angle α is 0°, while the covered portion on the opposite side thereof may be observed. Therefore, the luminance reduction does not substantially occur, as long as the portion of the shadow region generated with the black matrix layer BM superposes on the overlapping region of the organic EL element and the black matrix layer BM.

Example of Detailed Configuration of Display Device

Case Where No Vignetting Occurs

Therefore, in the organic EL display device 1B according to the second embodiment, when the portion in the shadow region generated with the black matrix layer BM superposes on the above-described overlapping region of the organic EL element and the black matrix layer BM, vignetting of the display light L may be perfectly prevented. That is, in consideration of Formula (24) and Formula (25) in the first embodiment, Formula (36) below may be established. Thereby, within the range where the viewing angle is from 0° to α both inclusive, vignetting of the display light L from the organic EL element, due to the light-shielding with the black matrix layer BM, does not occur at all.

$$\alpha \leq \tan^{-1}((W_{EL} - W_{BM})/(2 \times D)) \quad (36)$$

As described in the first embodiment, in the typical display device, even when vignetting occurs at the viewing angle α of 60° or more, it is thought that this is practically not a serious issue. Here, α is set to 60° because of the reason similar to that described in the first embodiment. It is thought that the viewing angle of 60° is not a deal of a mere mathematical formula, but is an angle to be reference for one skilled in the art. Therefore, when α=60° is substituted in Formula (36), Formula (37) below is established. However, similarly to the first embodiment, also in this case, in the case where the aperture ratio is small (case where the value of $(W_{EL} - W_{BM})$ is large), it means that the film thickness of the protective layer 13 and the sealing layer 14 is excessively thin. Therefore, in consideration of reduction in service life due to the increase in the current density, and the heat resistance in the process, the aperture ratio is desirably as large as possible (the value of $(W_{EL} - W_{BM})$ is as small as possible).

$$2\sqrt{3} \leq (W_{EL} - W_{BM})/D \quad (37)$$

In such an organic EL display device 1B, by satisfying Formula (35) and Formula (37) above, similarly to the first embodiment, it may be said as follows. That is, within the range where the viewing angle α is from 0° to 60° both inclusive, vignetting of the display light L from the photo-emission sections 16R, 16G, and 16B, due to the light-shielding with the black matrix layer BM, does not occur at all.

Also in the organic EL display device 1B according to the second embodiment, similarly to the first embodiment, the configuration is as follows. That is, the pixel size differs from each other in the pixels 10R, 10G, and 10B so that the degree of the deterioration due to aging is at the same level as each other in each of the colors. In addition to Formula (35) and Formula (37) above, Formula (38) below is also satisfied. Thereby, similarly to the first embodiment, it is possible to suppress the color shift in accordance with the viewing angle, due to the difference in the vignetting state in the pixels 10R, 10G, and 10B (for example, within the range where the viewing angle α is equal to or less than 60°, the viewing angle chromaticity shift Δuv equal to or less than 0.020 is satisfied).

$$0.95 \leq \text{relative difference of the values } (W_{BM}/D) \text{ among the pixels } 10R, 10G, \text{ and } 10B) \leq 1.05 \quad (38)$$

Case Where Vignetting Occurs to Some Extent

Next, similarly to the first embodiment, the case is considered where there is a region actually light-shielded due to the light-shielding with the black matrix layer BM within the angle range equal to or smaller than the viewing angle α. In other words, this is the case where vignetting of the display light L from the photo-emission sections 16R, 16G, and 16B occurs due to the light-shielding with the black matrix layer BM. In this case, in consideration of Formula (37) above, Formula (39) below is established. Similarly to the above-described case, when α=60° is substituted in Formula (39), Formula (40) below is established.

$$\alpha > \tan^{-1}((W_{EL} - W_{BM})/(2 \times D)) \quad (39)$$

$$2\sqrt{3} > (W_{EL} - W_{BM})/D \quad (40)$$

Here, the ratio of vignetting of the display light L, due to the light-shielding with the black matrix layer BM (ratio where the display light L is light-shielded), is proportional to the ratio between the dimension $L_B$ of the region actually light-shielded with the portion of the shadow region, and the opening dimension $W_{BM}$ in the black matrix layer BM. Thus, the ratio of vignetting of the display light L is expressed with Formula (41) below. That is, Formula (42) below may be satisfied so that the ratio of vignetting of the display light L is equal to or less than 50%. When Formula (42) is modified, Formula (43) is established.

$$\text{Ratio of vignetting of the display light } L = (L_B/W_{BM}) \quad (41)$$

$$0.5 \geq (L_B/W_{BM}) \geq 0 \quad (42)$$

$$0.5 \times W_{EL} \geq D \times \tan \alpha 0.5 \times (W_{EL} - W_{BM}) \quad (43)$$

Similarly to the first embodiment, as the application range of the viewing angle α, when the reasonable numerical value range from 30° to 60° is applied to Formula (43), Formula (44) below is established.

$$(\sqrt{3}/2) \times W_{EL} \geq D \geq (1/2\sqrt{3}) \times (W_{EL} - W_{BM}) \quad (44)$$

In such an organic EL display device 1B, Formula (35), Formula (40) and Formula (44) above are satisfied. Thereby, in the case where the opening dimension $W_{BM}$ in the black matrix layer BM is equal to or smaller than the photo-emission region dimension $W_{EL}$ in each of the photo-emission sections 16R, 16G, and 16B, it may be said as follows. That is, within the range where the viewing angle α is from 0° to 60° both inclusive, even in the case where vignetting of the display light L from the organic EL element occurs due to the light-shielding with the black matrix layer BM, the ratio of vignetting of the display light L may be suppressed to equal to or less than 50%.

Also in this case, the pixel size differs from each other in the pixels 10R, 10G, and 10B so that the degree of the deterioration due to aging is at the same level as each other in each of the colors. In addition to Formula (35), Formula (40), and Formula (44), Formula (38) above is also satisfied. Thereby, similarly to the case described above, the color shift in accordance with the viewing angle, due to the difference in the vignetting state in the pixels 10R, 10G, and 10B, is suppressed (for example, within the range where the viewing angle α is equal to or smaller than 60°, the viewing angle chromaticity shift Δuv equal to or smaller than 0.020 is satisfied).

As described above, in the second embodiment, in the case where the organic EL element (photo-emission sections 16R, 16G, and 16B) as the self-luminous photo-emission element, and the black matrix layer BM are provided, and Formula (35) and Formula (37) above are satisfied, vignetting of the display light L from the photo-emission sections 16R, 16G, and 16B (organic EL elements), due to the light-shielding with the black matrix layer BM, does not occur at all, within the range where the viewing angle α is from 0° to 60°. Thereby, it is possible to improve the viewing angle characteristic of the luminance. Moreover, since the pixel size differs from each other in the pixels 10R, 10G, and 10B, the degree of the deterioration due to aging may be at the same level as each other. Moreover, since Formula (38) above is satisfied, it is possible to suppress the color shift in accordance with the viewing angle. Therefore, in the display device including the self-luminous photo-emission element, it is possible to realize long service life of the whole panel, while improving the display quality.

Here, the case is described where the organic EL element (photo-emission sections 16R, 16G, and 16B) as the self-luminous photo-emission element and the black matrix layer BM are provided, and Formula (35), Formula (40), and Formula (44) above are satisfied. In the case where the opening dimension $W_{BM}$ in the black matrix layer BM is equal to or smaller than the photo-emission region dimension $W_{EL}$ of each of the photo-emission sections 16R, 16G, and 16B (organic EL elements), even when vignetting of the display light L from the organic EL element, due to the light-shielding with the black matrix layer BM, is generated within the range where the viewing angle α is from 0° to 60°, the ratio of vignetting of the display light L is suppressed to equal to or less than 50%, and it is possible to improve the viewing angle characteristic of the luminance. Moreover, since the pixel size differs from each other in the pixels 10R, 10G, and 10B, the degree of the deterioration due to aging may be at the same level as each other. Moreover, since Formula (38) above is satisfied, it is possible to suppress the color shift in accordance with the viewing angle. Therefore, in the display device including the self-luminous photo-emission element, it is possible to realize long service time of the whole panel, while improving the display quality.

Without being limited to the configurations similar to those of FIGS. 5 and 6 described in the first embodiment, the pixels 10R, 10G, and 10B according to the second embodiment may have, for example, the configuration of the organic EL display device 1A illustrated in FIG. 8, and the configuration illustrated in FIG. 9. In the case where the air length D differs from each other in each of the colors as illustrated in FIG. 8 (for example, the case where the relative difference of the air lengths D is within ±5% in each of the colors), the values of $W_{BM}$ in Formula (38) may be equal to each other in each of the colors. Also in this case, the configuration in FIG. 8 may be combined with the configurations of FIGS. 5 and 6.

3. Modification

Hereinbefore, although the present invention is described with the first embodiment and the second embodiment, the present invention is not limited to these embodiments, and various modifications may be made.

For example, in the first embodiment and the second embodiment described above, the case is described where the dimensions in the pixels 10R, 10G, and 10B have the relationship of $L_{RH} < L_{GH} < L_{BH}$, and $L_{RV} < L_{GV} < L_{BV}$. However, it is not limited to this order. That is, the size order of the dimensions (size order in each of the colors) in each of the pixels 10R, 10G, and 10B may be arbitrarily set according to an application or the like.

In the first embodiment and the second embodiment described above, as an example of the self-luminous display device including the self-luminous photo-emission element, the organic EL display devices 1, 1A, and 1B each including the organic EL element in each of the photo-emission sections 16R, 16G, and 16B are described. However, the present invention is not limited to be applied to this. That is, for example, the present invention may be applied to other self-luminous display devices such as an inorganic EL display device including an inorganic EL element as the self-luminous photo-emission element, and an FED (field emission display).

The present application contains subject matter related to that disclosed in Japanese Priority Patent Application JP 2008-291352 filed in the Japan Patent Office on Nov. 13, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a pair of substrates in which a plurality of pixels are disposed in a matrix form as a whole, the pixels being configured with pixels corresponding to R (red), G (green), or B (blue), and the pixels corresponding to the R, G, or B having size different from each other;
a self-luminous photo-emission element formed in a region corresponding to each of the pixels, on one of the pair of substrates; and
a black matrix layer formed in a region corresponding to between the pixels, on the other of the pair of substrates, wherein
formula (1) and formula (2) below are satisfied, or formula (1) and formula (3) below are satisfied: $2\sqrt{3} \leq (|W_{BM} - W_{LD}|/D) \ldots$ (1), $0.95 \leq$ (relative difference of values ($W_{LD}/D$) among the pixels corresponding to the R, G, and B) $\leq 1.05$ (when $W_{LD} < W_{BM}$) $\ldots$ (2), and $0.95 \leq$ (relative difference of values ($W_{BM}/D$) among the pixels corresponding to the R, G, and B) $\leq 1.05$ (when $W_{LD} \geq W_{BM}$) $\ldots$ (3), where $W_{BM}$ is an opening dimension in the black matrix layer, $W_{LD}$ is a photo-emission region dimension in the photo-emission element, and D is an air length between the photo-emission element and the black matrix layer.

2. The display device according to claim 1, wherein the formula (2) or the formula (3) are satisfied in a dimension of a horizontal direction in the opening dimension $W_{BM}$ in the black matrix layer, and the photo-emission region dimension $W_{LD}$ in the photo-emission element.

3. The display device according to claim 1, wherein, among the pixels corresponding to the R, G, and B, values $W_{LD}$ are equal to each other in the formula (2) or the formula (3), or values $W_{BM}$ are equal to each other in the formula (2) or the formula (3).

4. The display device according to claim 1, wherein the photo-emission element is made of an organic EL element, and the display device is configured as an organic EL display device.

5. A display device comprising:
a pair of substrates in which a plurality of pixels are disposed in a matrix form as a whole, the pixels being configured with pixels corresponding to R (red), G (green), or B (blue), and the pixels corresponding to the R, G, or B having size different from each other;
a self-luminous photo-emission element formed in a region corresponding to each of the pixels, on one of the pair of substrates; and
a black matrix layer formed in a region corresponding to between the pixels, on the other of the pair of substrates, wherein
formula (4) to formula (7) below are satisfied: $2\sqrt{3} > (|W_{BM} - W_{LD}|/D) \ldots$ (4), $W_{LD} < W_{BM} \ldots$ (5), $(\sqrt{3}/2) \times$ $W_{BM} \geq D \geq (1/2\sqrt{3}) \times (W_{BM} - W_{LD})$ ... (6), and $0.95 \leq$ (relative difference of values ($W_{LD}/D$) among the pixels corresponding to the R, G, and B)$\leq 1.05$ ... (7), where $W_{BM}$ is an opening dimension in the black matrix layer, $W_{LD}$ is a photo-emission region dimension in the photo-emission element, and D is an air length between the photo-emission element and the black matrix layer.

6. The display device according to claim 5, wherein the formula (7) is satisfied in a dimension of a horizontal direction in the opening dimension $W_{BM}$ in the black matrix layer, and the photo-emission region dimension $W_{LD}$ in the photo-emission element.

7. The display device according to claim 5, wherein, among the pixels corresponding to the R, G, and B, values $W_{LD}$ are equal to each other in the formula (7).

8. The display device according to claim 5, wherein the photo-emission element is made of an organic EL element, and the display device is configured as an organic EL display device.

9. A display device comprising:
   a pair of substrates in which a plurality of pixels are disposed in a matrix form as a whole, the pixels being configured with pixels corresponding to R (red), G (green), or B (blue), and the pixels corresponding to the R, G, or B having size different from each other;
   a self-luminous photo-emission element formed in a region corresponding to each of the pixels, on one of the pair of substrates; and
   a black matrix layer formed in a region corresponding to between the pixels, on the other of the pair of substrates, wherein
   formula (8) to formula (11) below are satisfied: $2\sqrt{3} > (|W_{BM} - W_{LD}|/D)$ ... (8), $W_{LD} \geq W_{BM}$ ... (9), $(\sqrt{3}/2) \times W_{LD} \geq D \geq (1/2\sqrt{3}) \times (W_{LD} - W_{BM})$ ... (10), and $0.95 \leq$ (relative difference of values ($W_{BM}/D$) among the pixels corresponding to the R, G, and B)$\leq 1.05$ ... (11), where $W_{BM}$ is an opening dimension in the black matrix layer, $W_{LD}$ is a photo-emission region dimension in the photo-emission element, and D is an air length between the photo-emission element and the black matrix layer.

10. The display device according to claim 9, wherein the formula (11) is satisfied in a dimension of a horizontal direction in the opening dimension $W_{BM}$ in the black matrix layer, and the photo-emission region dimension $W_{LD}$ in the photo-emission element.

11. The display device according to claim 9, wherein, among the pixels corresponding to R, G, and B, values $W_{BM}$ are equal to each other in the formula (11).

12. The display device according to claim 9, wherein the photo-emission element is made of an organic EL element, and the display device is configured as an organic EL display device.

* * * * *